(12) United States Patent
Masumura et al.

(10) Patent No.: US 6,858,924 B2
(45) Date of Patent: Feb. 22, 2005

(54) FLIP-CHIP SEMICONDUCTOR DEVICE HAVING I/O MODULES IN AN INTERNAL CIRCUIT AREA

(75) Inventors: Yoshihiro Masumura, Kanagawa (JP); Nobuteru Oh, Kanagawa (JP); Hiroyuki Furukawa, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/445,040

(22) Filed: May 27, 2003

(65) Prior Publication Data

US 2003/0222355 A1 Dec. 4, 2003

(30) Foreign Application Priority Data

May 28, 2002 (JP) ........................................ 2002-153691

(51) Int. Cl.[7] .............................................. H01L 23/02
(52) U.S. Cl. ........................ 257/678; 257/693; 257/731
(58) Field of Search ................................ 257/691, 693, 257/713, 730, 731, 778, 678

(56) References Cited

U.S. PATENT DOCUMENTS 5,202,624 A * 4/1993 Gheewala et al. .......... 324/754

FOREIGN PATENT DOCUMENTS

JP 2001-223335 A 8/2001

* cited by examiner

Primary Examiner—Phuc T. Dang
(74) Attorney, Agent, or Firm—Sughrue Mion, PLLC (57) ABSTRACT

A semiconductor device includes an internal circuit area including a plurality of I/O modules, and a peripheral area receiving therein a pair of loop test lines for testing I/O buffers in the I/O modules. The internal test line extending from each of the loop test lines toward the internal circuit area includes an out-module test line formed as the topmost layer, a first in-module test line formed as the topmost layer and connected to the out-module test line, and a second in-module test line, a portion of which is formed by connecting the in-buffer test lines together.

9 Claims, 9 Drawing Sheets

FLIP-CHIP SEMICONDUCTOR DEVICE HAVING I/O MODULES IN AN INTERNAL CIRCUIT AREA

BACKGROUND OF THE INVENTION (a) Field of the Invention

The present invention relates to a flip-chip semiconductor device having I/O modules in an internal circuit area and, more particularly, to the structure of internal test lines for testing I/O modules provided in the internal circuit area of a flip-chip semiconductor device.

(b) Description of the Related Art

Flip-chip semiconductor devices are known as ICs which are mounted on BGA packages. The flip-flop semiconductor device has peripheral input/output (I/O) pads disposed in the peripheral area of the semiconductor device, and internal I/O pads formed as flip-flop bumps and disposed in the inner area of the semiconductor device. I/O buffers of the semiconductor device are generally disposed in the peripheral area and receive/deliver external signals via the peripheral I/O pads. In general, the external signal has a higher voltage than the internal signals, and thus the I/O buffers are disposed in the peripheral area far from the internal circuit area for preventing the noise from entering the internal circuit area.

Figure 6:
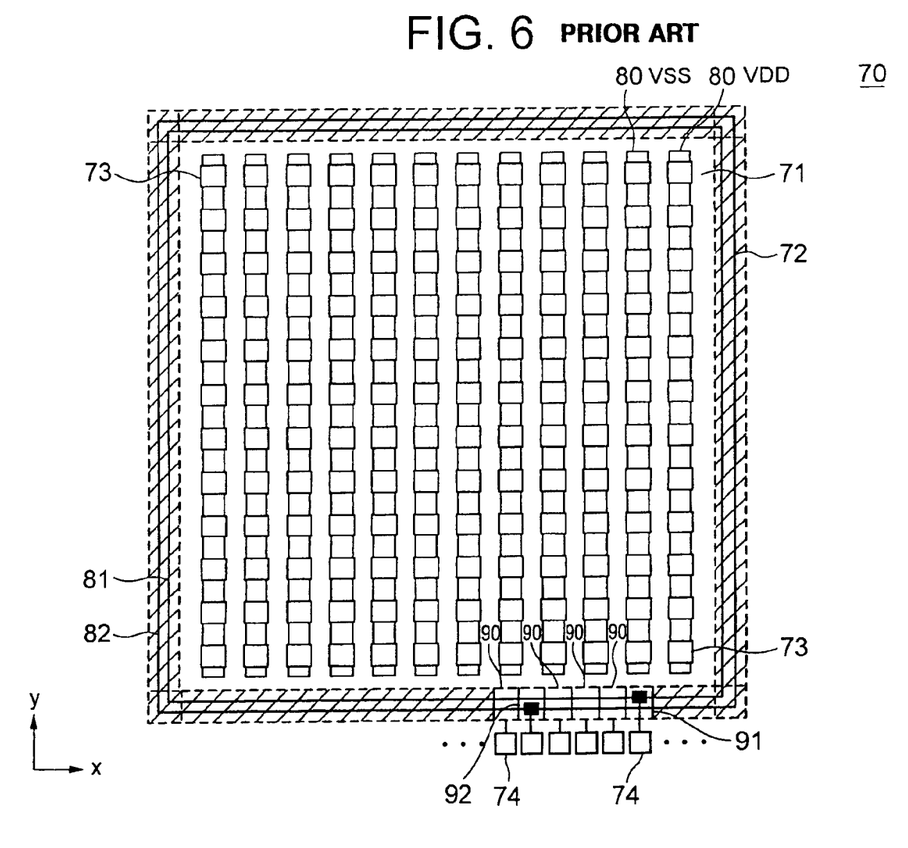
FIG. 6 is a top plan view of a conventional semiconductor device as viewed from the side of I/O pads.

FIG. 6 shows a conventional flip-flop semiconductor device in a top plan view as viewed from the side of the I/O pads. The semiconductor device 70 includes internal circuit area 71 and a peripheral area 72 surrounding the internal circuit area 71. The internal circuit area 71 receives therein a plurality of internal I/O pads 73 formed as flip-flop bumps and arranged in a matrix. The internal I/O pads 73 arranged in a row are connected together via a power source line 80 extending in the row (y) direction and formed as the topmost layer, thereby supplying power source to the internal core blocks constituting the internal circuit. The power source lines 80 include a high-potential,(VDD) source line and a low-potential (VSS) source line or ground line, which are arranged alternately with each other.

In the peripheral area 72, there are provided test blocks 91 and 92 for testing the I/O buffers 90. The peripheral I/O pads 74 are connected to respective I/O buffers 90 to receive/deliver external signals outside the semiconductor device 70. The test blocks 91 and 92 are connected to loop test lines 81 and 82, respectively, extending along the peripheral area 72 of the semiconductor device 70, thereby testing operation of the I/O buffers 90 while using the test signals received via the peripheral I/O pads 74. It is to be noted that some of the I/O buffers 90 are omitted for depiction, and that a large number of I/O buffers 90 are generally disposed in the whole peripheral area 72 to surround the internal circuit area 71.

Figure 7:
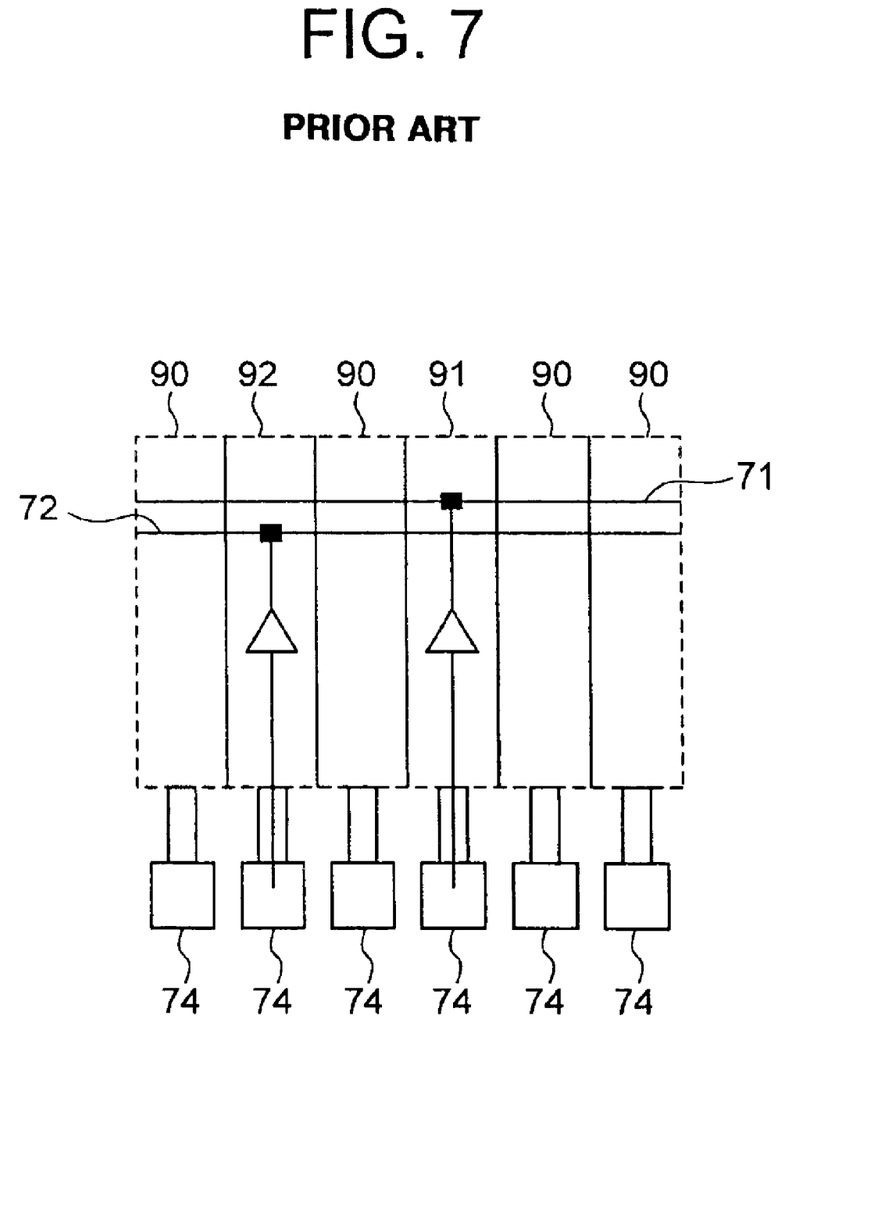
FIG. 7 is a top plan view of I/O buffers and test block disposed in the peripheral area shown in FIG. 6.

FIG. 7 shows the detail of some of the peripheral I/O buffers etc. disposed in the peripheral area 72. In the peripheral area 72, there are provided I/O buffers 90 and test blocks 91 and 92 arranged in a row. Each of the I/O buffers 90 and test blocks 91 and 92 is formed as a unit device having a rectangular area, wherein adjacent two unit devices are juxtaposed to each other, with the longer sides thereof being shared therebetween. Since the I/O buffer 90 and the test block 91 or 92 have the same design size, any one of the I/O buffers 90 can be replaced by a test block 91 or 92 in the peripheral area 72.

By juxtaposing the adjacent I/O buffers 90 or adjacent I/O buffer 90 and test block 91 or 92 to each other in the design, the pair of loop test line 81 and 82 are formed without an additional design. In other words, the loop test lines 81 and 82 shown in FIG. 6 are automatically arranged by disposing the unit devices without a space therebetween except for the four corner areas of the semiconductor device 70. The I/O buffer 90 has a test-operating function responding to the test signals supplied via the loop test lines 81 and 82.

Arrangement of the I/O buffers 90 in the peripheral area 72 limits the number of I/O buffers 90, which can be disposed in the semiconductor device 70, depending on the length of the peripheral area 72. Thus, if the number of external signals is larger relative to the circuit scale of the internal core blocks, the semiconductor device 70 suffers from the shortage of I/O buffers 90 which can be disposed in the semiconductor device 70. If the number of I/O buffers 90 is to be increased to avoid such a shortage, then the chip size of the semiconductor device 70 will be unreasonably increased.

For solving the above problem of the shortage of the I/O buffers, Patent Publication JP-A-2001-223335 describes a plurality of internal I/O modules each including a plurality of I/O buffers and disposed in the internal circuit area of the semiconductor device. The internal I/O module is surrounded by a guard band area for separation thereof from the internal core blocks. The described technique suppresses the adverse affect by the noise on the internal core blocks even if the external I/O signal for the I/O buffers has a higher voltage than the internal I/O signals for the internal core blocks. This obviates an undue increase in the chip size of the semiconductor device due to the increased number of I/O buffers.

However, since the internal I/O buffers disposed in the internal circuit area cannot be connected directly to the loop test lines such as 81 and 82 shown in FIG. 6, additional test lines must be disposed to connect the internal I/O buffers to the loop test lines. The additional test lines may be designed by using an auto-CAD design system as in the case of design for the signal lines of the internal core blocks. In such a case, since the internal I/O module is disposed in the internal circuit area, it may be considered that the additional test lines should be formed from an interconnect layer common with the signal lines of the internal core blocks.

Figure 8:
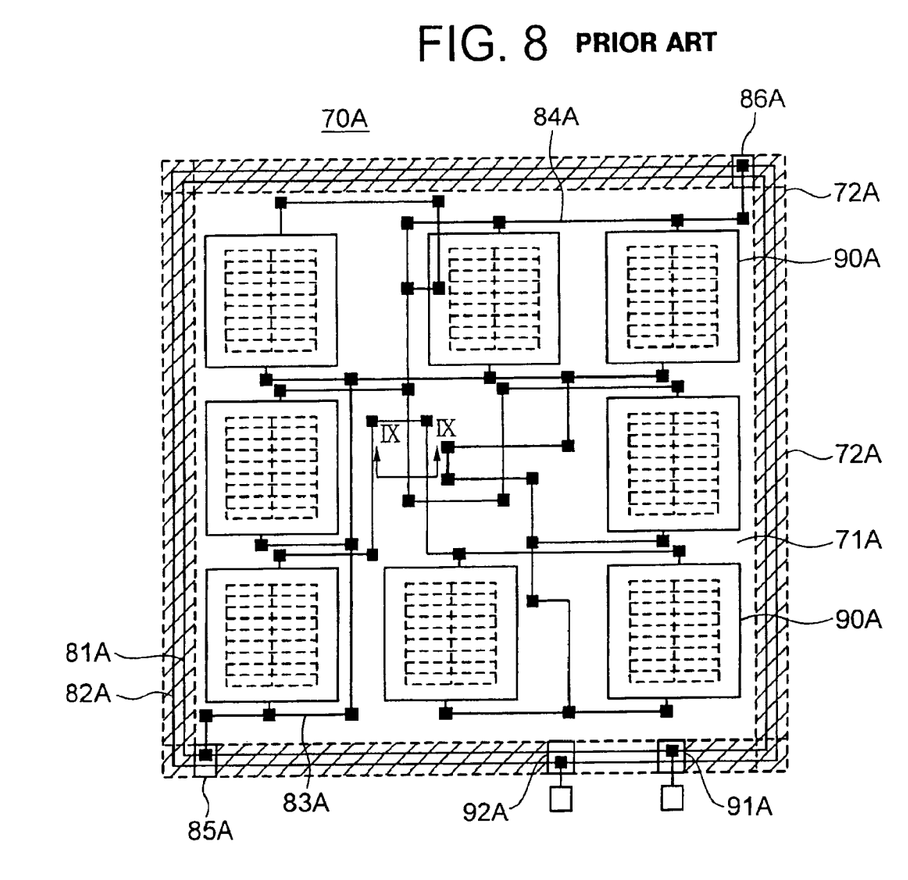
FIG. 8 is a top plan view of I/O buffers disposed in the internal circuit area of the conventional semiconductor device.

FIG. 8 shows an example of arrangement of the additional test lines connected to eight I/O modules and designed by using the auto-CAD design system. This example is different from the semiconductor device 70 shown in FIG. 6 in that the semiconductor device 70A shown in FIG. 8 has internal I/O modules 90A in the internal circuit area 71A. It is to be noted that the internal I/O pads and the power source lines are omitted for depiction in FIG. 8 and that the power source lines connect the internal I/O pads together in the column (y) direction in the area where no I/O module 90A is disposed.

The test signal input from the test block 91A is delivered to the internal circuit area 71A via the loop test line 81A in the peripheral area 72A and an interconnection cell 85A disposed therein for dedicated connection of the test lines. The test signal input from the test block 92A is delivered to the internal circuit area 71A via the loop line 82A in the peripheral area 72A and an interconnection cell 86A disposed therein. The internal test lines 83A and 84A are designed for the rout thereof by using the design rule of the auto-CAD design system similarly to other internal signal lines for the internal core blocks. It is to be noted that internal interconnect lines other than the internal test lines 83A and 84A are omitted for depiction in the drawing.

Figure 9:
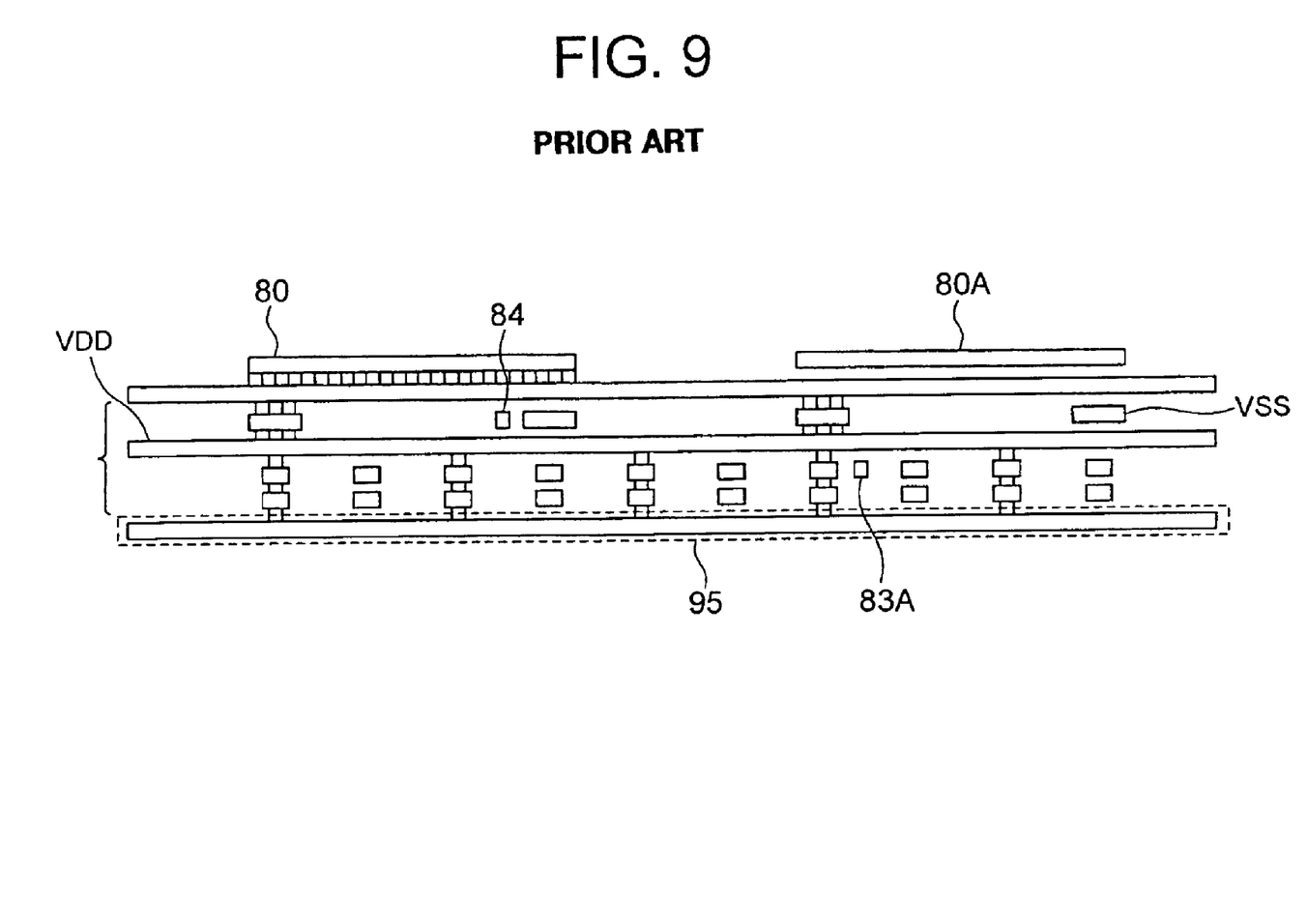
FIG. 9 is a sectional view taken along line IX—IX in FIG. 8.

FIG. 9 shows a sectional view taken along line IX—IX in FIG. 8. The topmost source lines 80A include a high-potential (VDD) source line and a VSS source line, overlying an internal core block 95A. In this example, three intermediate interconnect layers are sandwiched between the source lines 80A and the internal core block 95A in FIG. 9 and designed for routing by using the auto-CAD design system. Since the ordinary signal lines for the internal core block 95A and the internal test lines 83A and 84A are designed in a common layer, each of test lines 83A and 84A is depicted to extend adjacent to a corresponding signal line for the internal core block 61. This increases the restriction on the arrangement of the test lines and the signal lines for the internal core block 95A in consideration of the limited track area for the lines, thereby complicating the arrangement of the internal test lines 83A and 84A, as depicted in FIG. 8, while narrowing the design choice for the signal lines.

The auto-CAD design technique for the internal test lines 23 and 24 requires preparation of a netlist (interconnect list) information including connection information of the test lines from interconnection cells 85A and 86A to the I/O modules 90A. This increases the burden on the auto-CAD design system to reduce the throughput thereof. In addition, the juxtaposition of the ordinary signal lines having a potential of 1.5 volts, for example, and the internal test lines 83A and 84A having a potential of 3.3 volts, for example, causes a crosstalk therebetween, thereby affecting the test results on the I/O buffers 90A. It is generally difficult to verify the allowable range of crosstalk between the lines having different potentials, thereby complicating analysis of the test results.

SUMMARY OF THE INVENTION

In view of the above, it is an object of the present invention to provide a semiconductor device including I/O, buffers provided in the internal circuit area of the semiconductor device and capable of being tested by using a simple structure for the test lines.

The present invention provides a semiconductor device including an internal circuit area receiving therein input/output (I/O) pads and a peripheral area surrounding the internal circuit area, the internal circuit area receiving therein a plurality of internal I/O modules, each of the I/O modules including the I/O pads and a plurality of I/O buffers each corresponding to one of the I/O pads, and at least one internal test line for supplying a common test signal to the I/O buffers, wherein the internal test line includes: an out-module test line extending outside an area of the internal I/O module and formed as a common layer with the I/O pads; a first in-module test line extending within the area of the internal I/O module and formed as the common layer; and a second in-module test line extending within the area of the internal I/O module and connected between the first in-module test line and the I/O buffers.

In accordance with the semiconductor device of the present invention, since the internal test line is not disposed in a common layer with the signal lines for internal core blocks in the internal circuit area, the signal lines can be disposed without a locational interference with the internal test lines and less suffers from the adverse affection by the noise generated by the internal test line. In addition, the structure of the common layer for the internal test lines and the I/O pads does not increase the number of interconnect layers in the semiconductor device.

The above and other objects, features and advantages of the present invention will be more apparent from the following description, referring to the accompanying drawings.

PREFERRED EMBODIMENTS OF THE INVENTION

Now, the present invention is more specifically described with reference to accompanying drawings.

Figure 1:
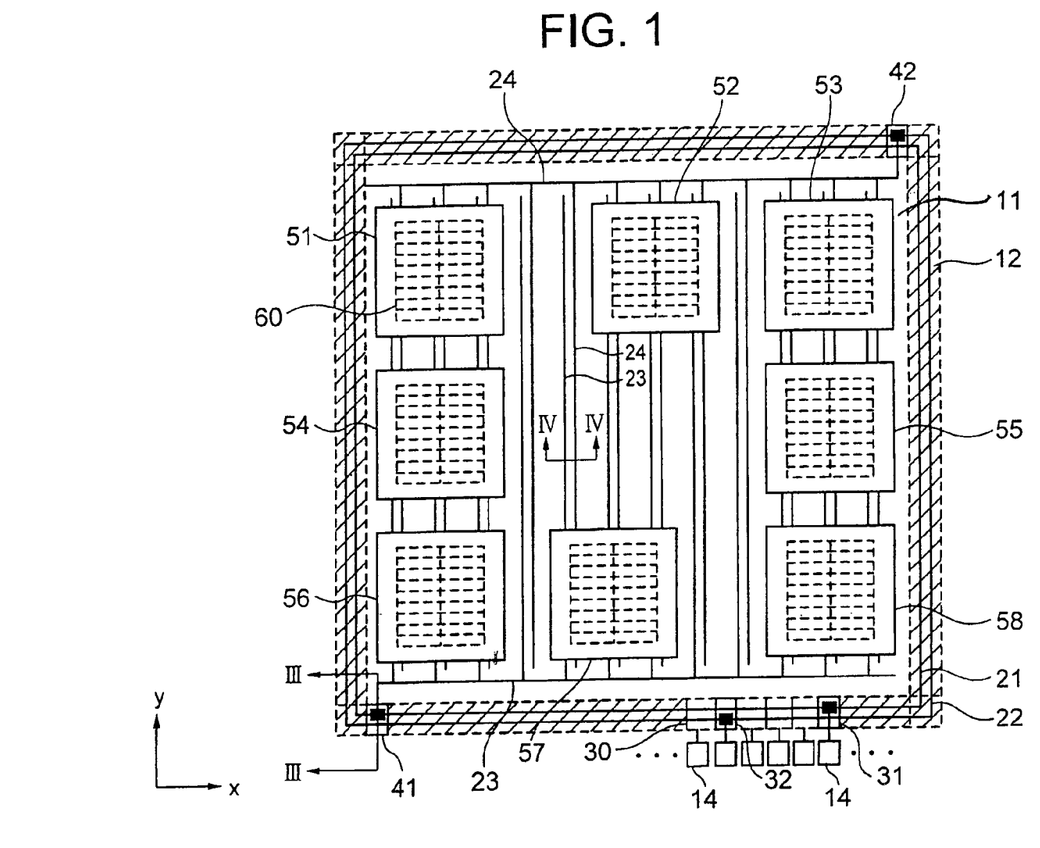
FIG. 1 is a top plan view of a semiconductor device according to a first embodiment of the present invention.

Referring to FIG. 1, a semiconductor device according to an embodiment of the present invention includes an internal circuit area 11 and a peripheral area 12 surrounding the internal circuit area 11 and shown as a hatched area in FIG. 1. The semiconductor device 10 has a pair of internal test lines 23 and 24 formed as a topmost layer in the internal circuit area 11. In FIG. 1, the source lines and the internal I/O pads are omitted for depiction, wherein each of the source lines connect together the internal I/O pads arranged in a row at the area where no internal I/O modules are disposed.

Figure 2:
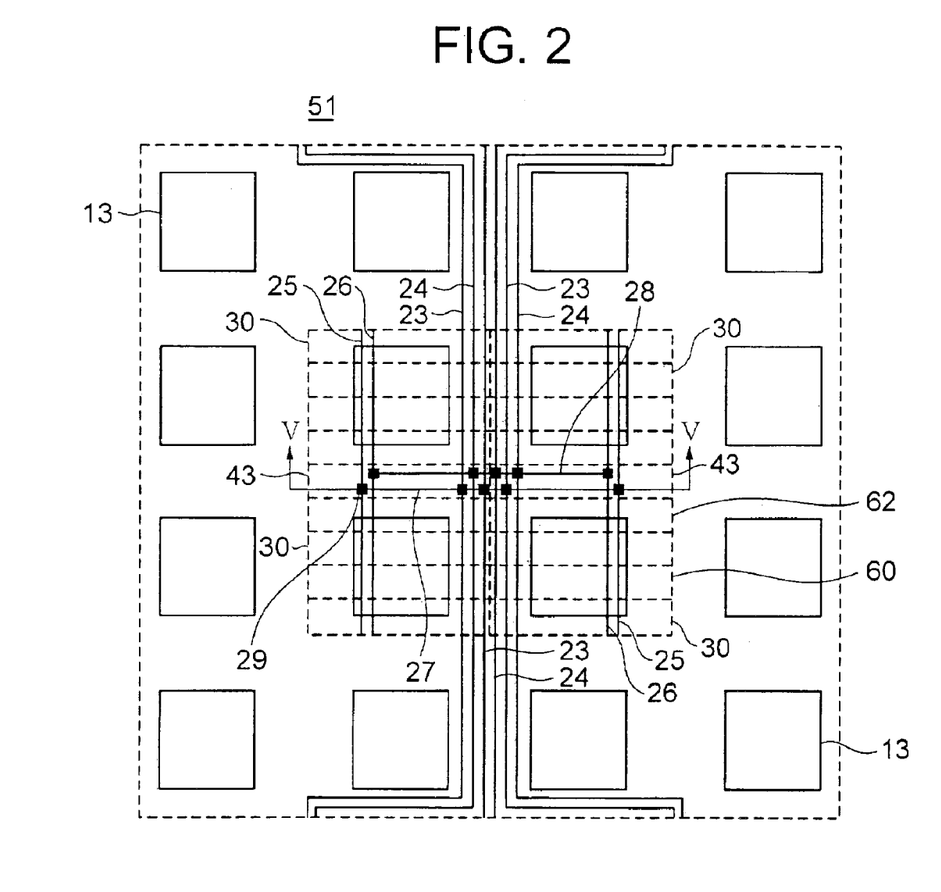
FIG. 2 is a top plan view of the I/O module shown in FIG. 1.

The internal circuit area 11 receives therein a plurality of I/O modules 51 to 58 having a similar structure. The detail of one of the modules 51 to 58 is shown in FIG. 2, wherein the I/O module 51 receives therein 4×4 I/O pads 13. The peripheral area 12 receives therein a pair of loop test lines 21 and 22, a plurality of I/O buffers 30, a pair of test blocks 31 and 32, and a pair of interconnection cells 41 and 42. The internal test line 23 is connected to an I/O pad 14 via the test block 31, loop test line 21 and the interconnection cell 41 to deliver a test signal to the I/O modules 51 to 58. The internal test line 24 is connected to a peripheral I/O pad 14 via the test block 32, loop test line 24 and interconnection cell 42 to deliver a test signal to the I/O modules 51 to 58.

Figure 3:
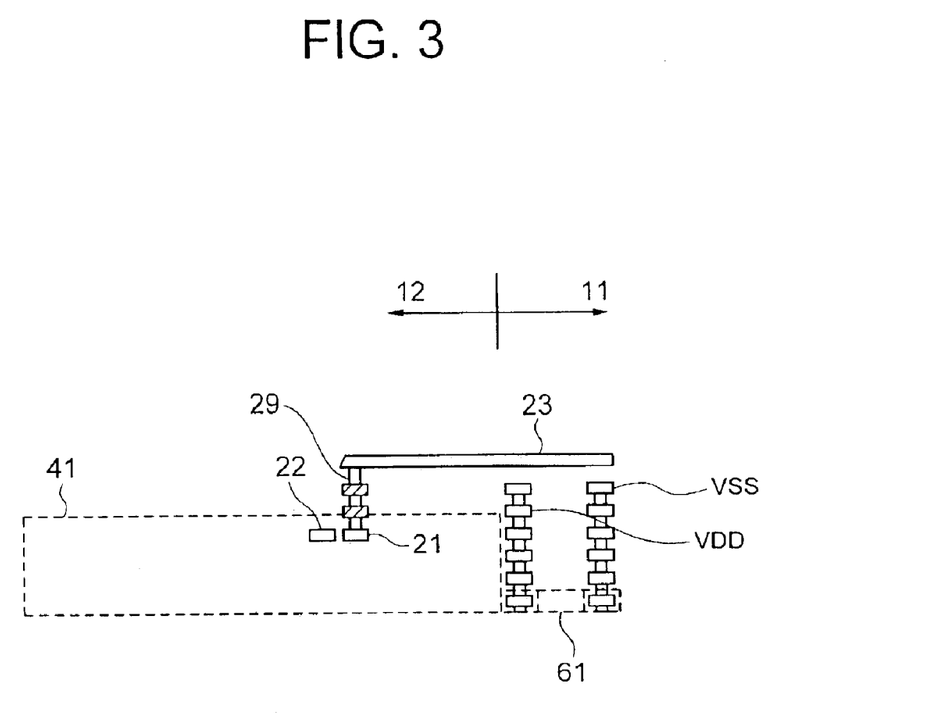
FIG. 3 is a sectional view taken along line III—III in FIG. 1.

Referring to FIG. 3, the internal core block 61 is connected to VDD and VSS power source lines in the internal circuit area 11 via through-holes. The loop test line 21 disposed in the peripheral area 12 is connected to the topmost layer constituting a portion of the internal test line 23 via through-holes in the interconnection cell 41. The interconnection cell 42 is similar to the interconnection cell 41, and connects the loop test line 22 to the internal test line 24 formed as the topmost layer.

Back to FIG. 1, the internal test line 23 extends in the column (y) direction from the interconnection cell 41 in the peripheral area 12 to the internal circuit area 11, then extends in the row (x) direction, and then branches in the y direction between each adjacent two of the internal I/O pads 13. The internal test line 24 extends in the column (y) direction from the interconnection cell 42 in the peripheral area 12 to the internal circuit area 11, then extends in the row (x) direction, and then branches in the y direction between each adjacent two of the internal I/O pads 13 to extend adjacent to a corresponding branch of the internal test line 23.

Figure 4:
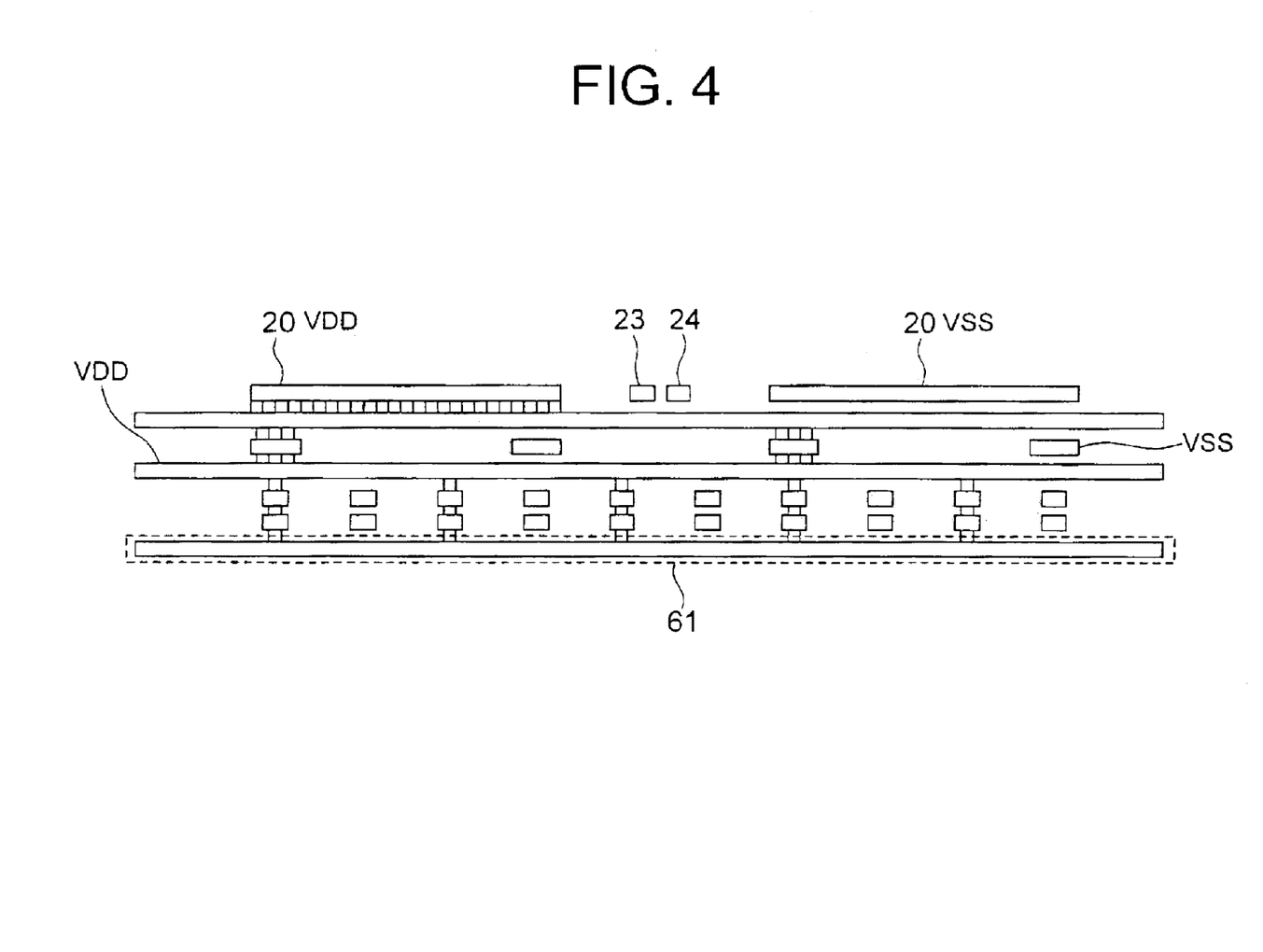
FIG. 4 is a sectional view taken along line IV—IV in FIG. 1.

Referring to FIG. 4, the pair of branches of the internal test lines 23 and 24 extend between adjacent two of internal I/O pads, i.e., between the VDD source line 20 and the VSS source line 20 disposed as the topmost layer.

Back to FIG. 2, the I/O module 51 includes 4×4 I/O pads 13, and a buffer group 60 including 4×4 buffers 30 corresponding to the I/O pads 13 and a pair of interconnection cells 43. The buffer group 60 is surrounded by a guard band area 62. The interconnection cell 43 has the same size as the I/O buffers 30 and includes through-holes for connecting the branches of the internal test lines 23 and 24 to the in-buffer test lines 25 and 26, respectively.

The internal I/O pads 13 are connected to underlying I/O buffers 30 to deliver external signal to the I/O buffers 30 or to drive external signal by the I/O buffers 30. The I/O buffers 30 and the interconnection cells 43 have respective in-buffer test lines 25 and 26. The in-buffer test line 25 and 26 disposed in the I/O buffers 30 and the interconnection cells 43 are connected together to form in-module test lines by juxtaposing the I/O buffers 30 and the interconnection cell 43 as in the case of the peripheral test lines 71 and 72 shown in FIG. 7.

As understood from the above description, the internal test lines 23 and 24 include in-module test lines extending in the I/O modules 30 and out-module test lines extending outside the I/O modules 30. The in-module test lines 23 and 24 pass by the internal of the I/O module 51 from one edge toward the opposing edge in the y direction, and connected to the out-module test lines 23 and 24 at the one and the opposing edges.

The pair of in-module test lines 23 and 24 extend between respective adjacent two I/O pads at the one and opposing edges, and extend in a group including three pairs between the central adjacent two of the I/O pads in the central area of the I/O module as viewed in the y direction. In addition, the in-module test lines include the topmost test lines 23 and 24, underlying test lines 27 and 28 extending normal to the topmost test lines 23 and 24 and connected to the same via through-holes, and further underlying in-buffer test lines 25 and 26 extending normal to the test lines 27 and 28.

Figure 5:
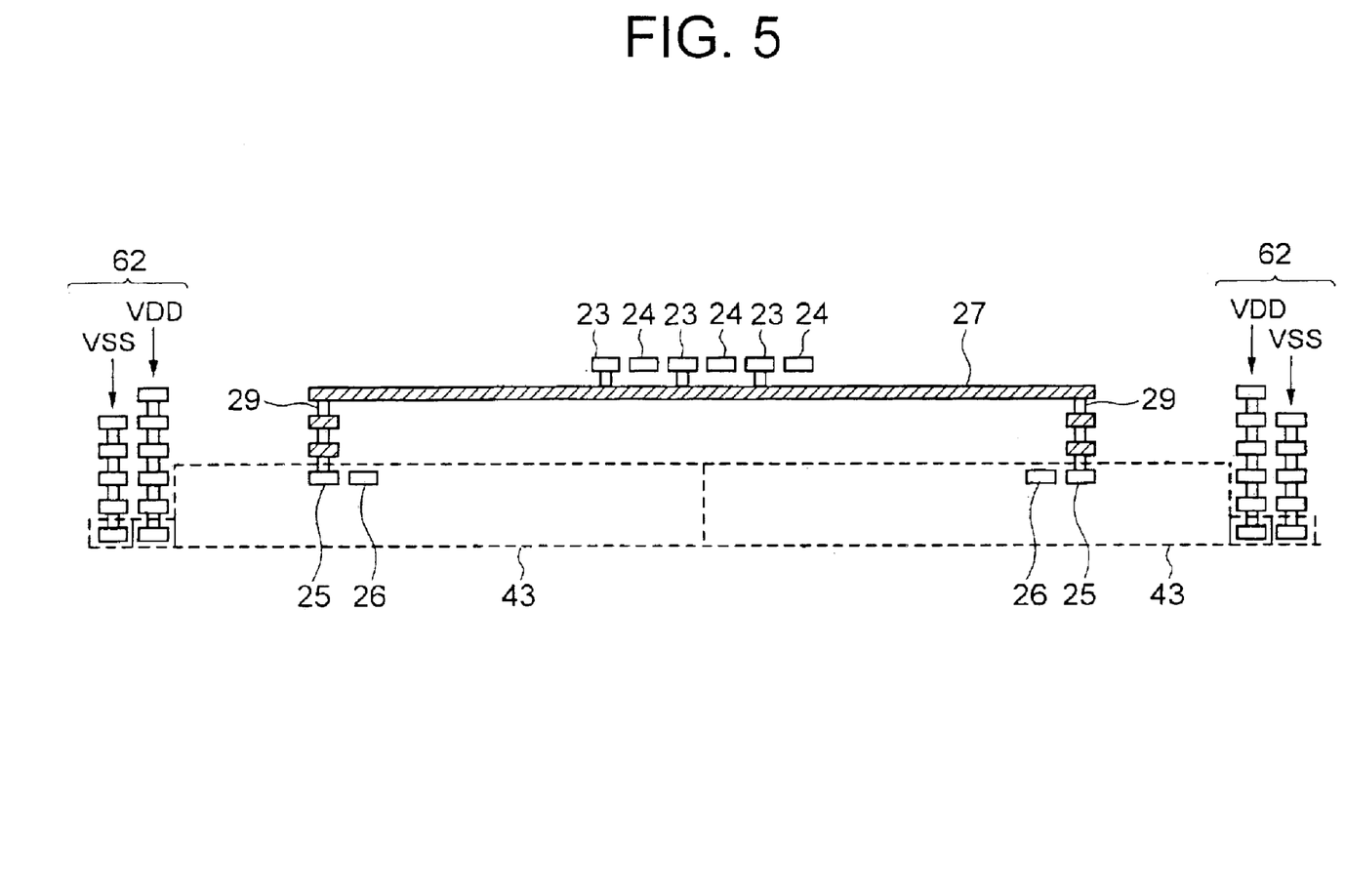
FIG. 5 is a sectional view taken along line V—V in FIG. 2.

Referring to FIG. 5 showing a sectional view taken along line V—V in FIG. 2, the guard band area 62 surrounding the I/O buffer group 60 of the I/O module 51 is formed by a pair of groups of via-plugs which are respectively connected to the VDD source line and VSS source line, thereby protecting the internal circuit against the noise generated in the I/O module 51. The topmost test lines 23 and 24 are connected to the underlying test lines 27 and 28, respectively, in the interconnection cell 43. The underlying test lines 27 and 28 are further connected to the in-buffer test lines 25 and 26, respectively, through via-plugs.

According to the present embodiment, since the I/O modules 51 to 58 are connected to the topmost test lines 23 and 24 overlying the signal lines for the internal core blocks, the design for the test lines and signals lines is simpler compared to the conventional technique using the auto-CAD design system.

In an alternative of the above embodiment, the I/O modules 51 to 58 may be arranged along a straight line in the column direction, as in the case of I/O modules 51, 54 and 56, or may be arranged in the column direction with a deviation corresponding to the pitch of the I/O pads, as in the case of I/O modules 52 and 57. More generally, the I/O modules may be disposed at any location of the internal circuit area. Change of the location for the I/O modules in the design does not require the location change of the out-module test lines 23 and 24 because the test lines are disposed in the topmost layer.

The arrangement of the internal test lines in the layer different from the layer of the signal lines increases the design choice of the location of the signal lines for the internal core blocks. The sufficient distance assured by the different layers between the test lines and the signal lines having different voltages reduces the crosstalk between the test lines and the signal lines, and obviates the necessity of verification for the allowable range of the crosstalk.

Since each of the interconnection cells 41 to 43 has the same size as the I/O buffers 30, the location of the interconnection cells may be selected as desired. Test blocks 31 and 32 may be disposed in the I/O module in the internal circuit area 11 instead of or in addition to the peripheral area 12. However, the interconnection cells 41 to 43 and the test blocks 31 and 32 may have sizes different from the size of the I/O buffers 30.

The pair of internal test lines 23 and 24 may be disposed in the every other column space between the VDD source line and the VSS source line, or may be separated to adjacent column spaces between the VDD source line and the VSS source line. The test lines 23 and 24 may be removed from a portion of the internal circuit area 11 where no internal I/O module is disposed. The test lines 23 and 24 may enter the internal circuit area 11 from the peripheral area 12 at the same edge of the semiconductor device.

Since the above embodiments are described only for examples, the present invention is not limited to the above embodiments and various modifications or alterations can be easily made therefrom by those skilled in the art without departing from the scope of the present invention.

What is claimed is:

1. A semiconductor device comprising an internal circuit area receiving therein a plurality of input/output (I/O) pads arranged in an array and a peripheral area surrounding said internal circuit area, said internal circuit area receiving therein a plurality of internal I/O modules, each of said I/O modules including said I/O pads and a plurality of I/O buffers each corresponding to one of said I/O pads, and at least one internal test line for supplying a common test signal to said I/O buffers, wherein said internal test line includes:

an out-module test line extending outside an area of said internal I/O module and formed as a common layer with said I/O pads;

a first in-module test line extending within said area of said internal I/O module and formed as said common layer; and a second in-module test line extending within said area of said internal I/O module and connected between said first in-module test line and said I/O buffers.

2. The semiconductor device according to claim 1, wherein said out-module test line includes a plurality of branch lines each extending between adjacent two of said I/O pads.

3. The semiconductor device according to claim 1, wherein said out-module test line includes a plurality of branch lines each extending between a pair of source lines.

4. The semiconductor device according to claim 1, wherein said at least one internal test line include a pair of internal test lines.

5. The semiconductor device according to claim 4, wherein each of said pair of internal test lines includes a plurality of branch lines, and one of said branch lines of one of said internal test lines and a corresponding branch line of the other of said interconnect lines form a pair extending adjacent to each other.

6. The semiconductor device according to claim 1, wherein said second in-module test line includes a first portion connected to said first in-module test line, and a second portion connected to said first portion and extending normal to said first portion.

7. The semiconductor device according to claim 6, wherein said second portion is formed by serially connecting in-buffer test lines of said I/O buffers juxtaposed with one another.

8. The semiconductor device according to claim 1, wherein said I/O buffers of each of said I/O modules are surrounded by a guard band area maintained at a fixed potential.

9. The semiconductor device according to claim 1, wherein said I/O pads are formed as flip-flop bumps.

* * * * *